United States Patent [19]

Shintaku et al.

[11] Patent Number: 5,130,691

[45] Date of Patent: Jul. 14, 1992

[54] SUPERCONDUCTIVE APPARATUS HAVING A SUPERCONDUCTIVE DEVICE IN A AIRTIGHT PACKAGE

[75] Inventors: Hidetaka Shintaku; Shuhei Tsuchimoto, both of Nara; Shoei Kataoka, Tokyo, all of Japan

[73] Assignee: Sharp Kabushiki Kaisha, Osaka, Japan

[21] Appl. No.: 416,417

[22] Filed: Oct. 3, 1989

[30] Foreign Application Priority Data

Oct. 5, 1988 [JP] Japan ................ 63-252781

[51] Int. Cl.$^5$ .................................... H01L 39/00
[52] U.S. Cl. .................. 338/32 S; 505/881; 505/1; 324/248
[58] Field of Search .............. 338/325; 357/5; 324/248; 374/176, 178, 186; 505/881, 1; 307/306

[56] References Cited

U.S. PATENT DOCUMENTS

| | | | |
|---|---|---|---|
| 2,994,203 | 8/1961 | Lackey et al. | 62/3.2 |
| 3,055,775 | 9/1962 | Crittenden, Jr. et al. | 338/32 S |
| 3,643,237 | 2/1972 | Anackev | 357/5 |
| 3,673,071 | 6/1972 | Pritchard, Jr. et al. | 357/5 X |
| 3,814,964 | 6/1974 | Ace | 313/39 |
| 3,998,592 | 12/1976 | Pyle | 422/52 |
| 4,255,465 | 3/1981 | Bernard et al. | 338/32 S X |
| 4,259,843 | 4/1981 | Kausch | 62/3.1 |
| 4,375,157 | 3/1983 | Boesen | 62/49.2 |
| 4,613,816 | 9/1986 | Zeamer | 324/248 |
| 4,884,111 | 11/1989 | Nishino et al. | 357/5 |

FOREIGN PATENT DOCUMENTS

| | | |
|---|---|---|
| 0288022 | 10/1988 | European Pat. Off. |
| 1393040 | 5/1963 | France |
| 422020 | 10/1966 | Switzerland |
| 1015985 | 1/1966 | United Kingdom |

OTHER PUBLICATIONS

Article: "An Overview of Jposephson Packaging", Alan V. Brown; Mar. 1980; pp. 167–171.
Article: "Superconducting Nb-Nb$_x$O$_y$-Pb Tunnel Junctions As High Resolution Detectors for Nuclear Spectroscopy"; Barone et al.; Mar. 13, 1984; pp. 61–66.
Galvanomagnetic Effect of an Y-Ba-Cu-O Ceramic Superconductor and Its Application to Magnetic Sensors, Nojima et al., Japanese Journal of Applied Physics, vol. 27, No. 5, May, 1988 pp. 74–78.
Highly Sensitive Magnetic Sensor Using Y$_1$Ba$_2$Cu$_3$O$_{7-x}$ Films, R. Kita, et al., 5th Int'l. Workshop on Future Electron Devices, Jun. 2–4, 1988, Miyagi-Zao, pp. 231–234.
Novel Magnetic Sensor Using Y-Ba-Cu-O Ceramic Superconductor: Super Magneto-Resistor, Tsuchimoto, et al., Central Research Laboratories, Sharp Corporation, IEDM pp. 867–868.
Translations of Japanese patent laid open publication No. 65582/1985.
John Clarke; "Small-Scale Analog Applications of High-Transition-Temperature Superconductors", (Nature Vol. 333) May 1988; pp. 29–35.
Rabinowitz, Mario; "Superconductivity and Electric Power"; Forum for Applied Research and Public Policy; Spring 1988.

*Primary Examiner*—Marvin M. Lateef

[57] ABSTRACT

A superconductive apparatus has a superconductive device such as a superconductive magneto-resistive device. The superconductive device is mounted within an airtight package which is sealed to create an airtight state. Before sealing, the airtight package is evacuated to replace the internal air thereof with an inert gas.

10 Claims, 4 Drawing Sheets

SUPERCONDUCTIVE APPARATUS HAVING A SUPERCONDUCTIVE DEVICE IN A AIRTIGHT PACKAGE

BACKGROUND OF THE INVENTION

1. Field of the Invention

The present invention relates to a superconductive apparatus, and more particularly to a superconductive apparatus comprising a superconductive device airtightly packaged, such as a superconductive magneto-resistive device to be used as a magnetic sensor.

2. Description of Related Art

Conventionally, a magnetic sensor utilizing a superconductive magneto-resistive device has been proposed. In the magnetic sensor, there are formed a pair of current electrodes and a pair of voltage electrodes thereon. A current is supplied to the magnetic sensor by an external power source through lead wires which are connected to a pair of current electrodes. A voltage generated between a pair of voltage electrodes is measured to detect a change in the resistance thereof when a magnetic field is applied thereto. Therefore, the above magnetic sensor can detect an extremely small magnetic field by measuring the above voltage. The magnetic sensor has been used such that the magneto-resistive device thereof is exposed to the outside.

Since this sort of superconductive apparatii have such advantages that they have a simple structure and a high reliability, and also the manufacturing method thereof is relatively simple, they have been widely used. However, when the superconductive apparatii receive a thermal cycle which changes from room temperature to a low temperature such as the threshold temperature of the superconductive magneto-resistive device and vice versa, drops of water adhere to the surface of the superconductive magneto-resistive device thereby causing the compounds of the material to change to the other compounds resulting in the superconductive property of the superconductive magneto-resistive device deteriorating.

Further, since the surface of the superconductive magneto-resistive device is exposed to the outside, it is necessary to handle it carefully.

Furthermore, since the magnetic sensitivity of the superconductive magneto-resistive device varies depending upon the temperature thereof, it is necessary to measure the temperature of the superconductive magneto-resistive device upon cooling it in order to correct the measurement result of the magnetic field according to the above temperature dependency.

SUMMARY OF THE INVENTION

An essential object of the present invention is to provide a superconductive apparatus comprising a superconductive device wherein the superconductive property thereof does not deteriorate even after cooling it, and it is not necessary to handle the superconductor device carefully.

Another object of the present invention is to provide a superconductive apparatus comprising a superconductive device, capable of measuring the temperature of the superconductive device accurately.

In order to accomplish the above objects, according to one aspect of the present invention, there is provided a superconductive apparatus comprising: a superconductive device having electrodes; and an airtight package for mounting the superconductive device, the airtight package having terminals for connecting the electrodes of the superconductive device to an external apparatus, the airtight package being hermetically sealed to be airtight after replacing the internal air thereof with an inactive gas.

For example, drops of water can be prevented from adhering to the superconductor device resulting in the superconductive magneto-resistive property of the superconductive apparatus almost not deteriorating. Then, the reliability of the superconductive apparatus can be improved.

According to another aspect of the present invention, there is provided the superconductive apparatus further comprising: a resistance thermometer for measuring the temperature of the superconductive device, the resistance thermometer being mounted within the airtight package so as to be close to the superconductive device.

Therefore, the temperature of the superconductor can be measured accurately, and by correcting the magnetic sensitivity of the superconductive magneto-resistive device, an extremely small magnetic field can be measured accurately.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

A preferred embodiment according to the present invention will be described below with reference to the attached drawings.

Figure 1:
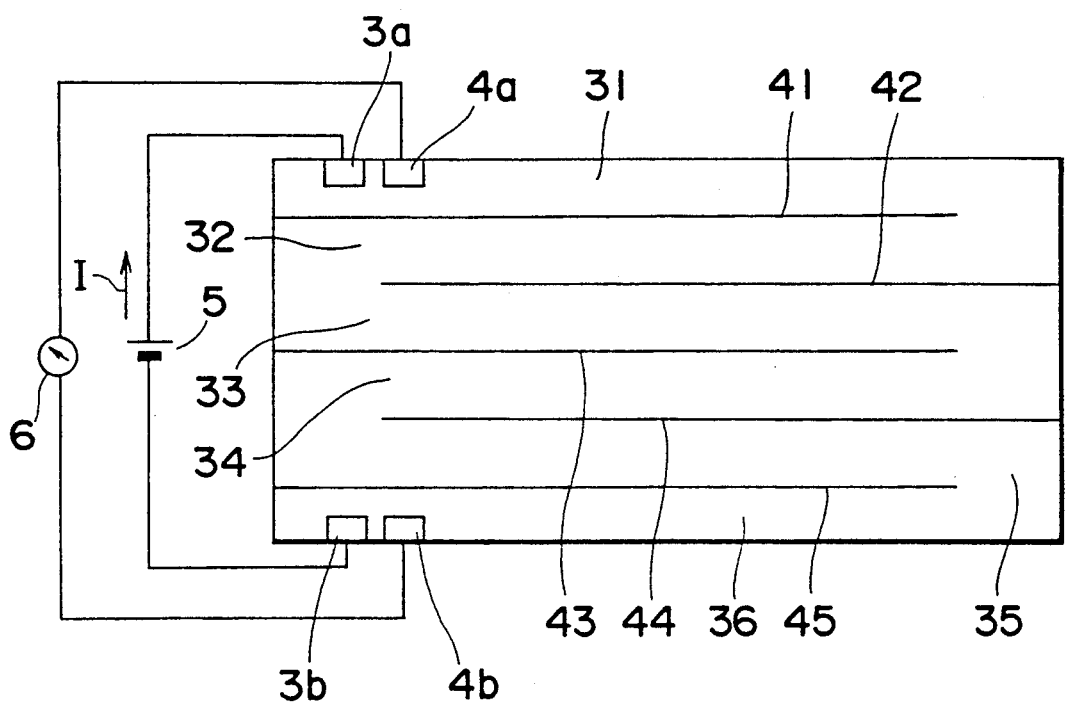
FIG. 1 is a top view of a superconductive magnetic sensor of a preferred embodiment according to the present invention.

FIG. 1 shows a superconductive magneto-resistive device of a preferred embodiment according to the present invention, made by a spray pyrolysis method, wherein the superconductive magneto-resistive device comprises superconductive strips 31 to 36 having point contact type weak couplings between grain boundaries thereof. The superconductive strips 31 to 36 being connected in series.

The superconductive magneto-resistive device is made of Y-Ba-Cu-O ceramic compounds. The materials of $Y(NO_3)_3.6H_2O$, $Ba(NO_3)_2$ and $Cu(NO_3)_2.3H_2O$ are used to produce the superconductive magneto-resistive device.

Figure 2:
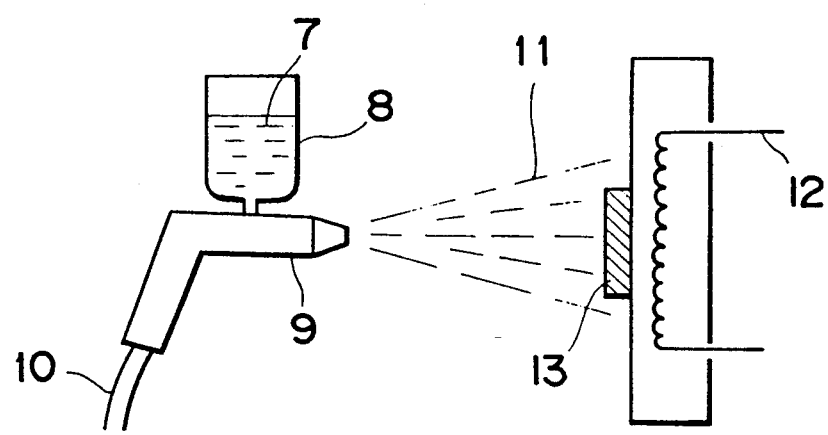
FIG. 2 is a schematic view showing a spray pyrolysis method for making a superconductive film used for the superconductive magnetic sensor shown in FIG. 1.

Powders of $Y(NO_3)_3.6H_2O$, $Ba(NO_3)_2$ and $Cu(NO_3)_2.3H_2O$ are weighed so that a composition ratio of Y, Ba and Cu becomes 1 : 2 : 3 in order to obtain a component of $Y_1Ba_2Cu_3O_{7-x}$ ($0 < X < 1$). Each powder is sufficiently dissolved into pure water so as to prepare an aqueous solution containing Y, Ba, and Cu nitrates. Thereafter, a magnetic sensor of the present preferred embodiment is made by the following method as shown in FIG. 2.

The aqueous solution 7 containing Y, Ba, and Cu nitrates, which is made as described above, is put into a container 8 of a spray gun 9. The aqueous solution 7 is made into a spray 11 having extremely minute particles by stirring up it sufficiently and is sprayed over yttrium-stabilized zirconia substrate 13 which is heated to about 600° C. by a heater 12. The spray gun 9 uses compressed air 10. Then, the aqueous solution 7 is repeatedly sprayed over an extremely small quantity thereof for about one hundred times at a relatively slow spraying speed without decreasing the temperature of the substrate 13 so as to form a film having a thickness of about 10 microns on the substrate 13.

In the above spray pyrolysis method, $N_2$ gas or $O_2$ gas can be used as the compressed air 10 of the spray gun 9. A good quality film having a thickness in the range from 0.5 microns to 50 microns can be made by the above spray pyrolysis method. The film having a thickness in the range from about 1 micron to about 10 microns can acted as a magnetic sensor having excellent characteristics. In the above spray pyrolysis method, the temperature at which the substrate 13 is heated may be changed in the range from 300° C. to 600° C.

The film made by the above spray pyrolysis method is heated to 950° C. for about 30 minutes in air and is sintered before cooling it gradually so as to form a ceramic superconductive film. The sintering temperature may be changed in the range from 900° C. to 1000° C., and the time for sintering the film may be changed in the range from about one minute to about sixty minutes depending on the thickness of the superconductive film to be formed.

It is to be noted that, when the thickness of the formed superconductive film is equal to or smaller than 0.2 microns, the filling rate of the formed superconductive film decreases and the uniformity thereof deteriorates. Furthermore, when the thickness thereof is larger than about 50 microns, the superconductive film cannot be formed tightly on the substrate 13, and also the measuring current to be supplied to the magnetic sensor upon measuring the magnetic flux density must be increased in order to obtain a predetermined sensitivity of the magnetic sensor.

The magnetic sensor is made as shown in FIG. 1, by using the superconductive film made by the spray pyrolysis method.

In the structure of the magnetic sensor, five slits 41 to 45 are formed in the superconductive film so as to form six superconductive strips 31 to 36 being connected in series, wherein the slits 41 to 45 are formed between the adjacent superconductive strips so as to separate them except for one end portion thereof. The slit for separating the upper pair of adjacent superconductive strips is formed so as to extend in a direction opposite to that of the slit for separating the lower pair of adjacent superconductive strips, resulting in a folded current path formed on the magnetic sensor. On both ends of strips 31 and 36, a pair of current electrodes 3a and 3b of Ti and a pair of voltage electrodes 4a and 4b of Ti are formed to have a tight fit by a vapor deposition method, respectively. A pair of current electrodes 3a and 3b are connected to a constant-current regulated power source 5 for supplying a constant current I through lead wires bonded on the electrodes 3a and 3b by use of Ag paste. A pair of voltage electrodes 4a and 4b are connected to a voltmeter 6 for measuring a voltage generated in the magnetic sensor through lead wires bonded on the electrodes 4a and 4b by use of Ag paste.

Figure 3:
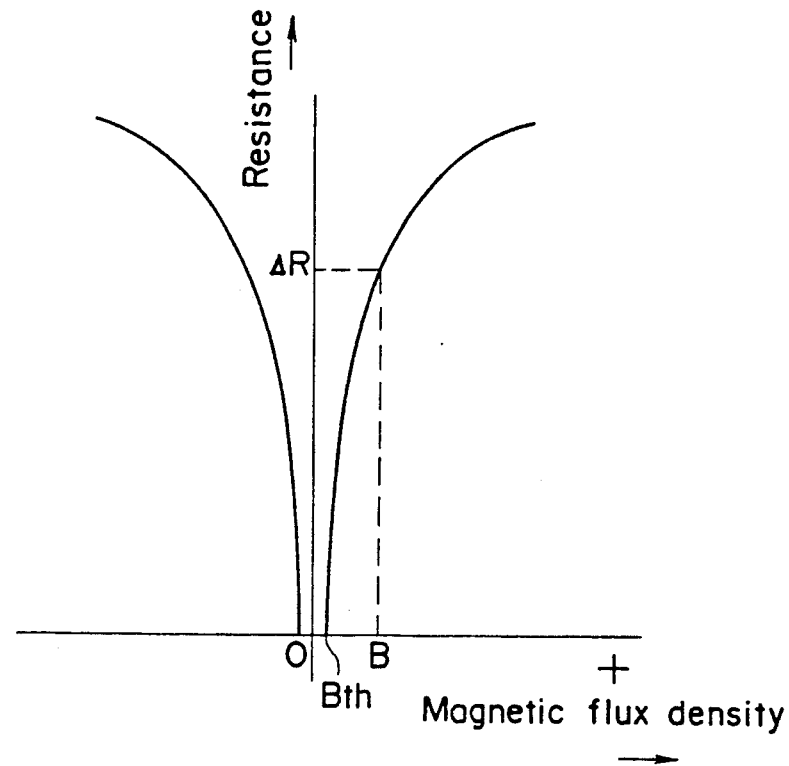
FIG. 3 is a graph showing a superconductive magneto-resistive property of the magnetic sensor shown in FIG. 1.

FIG. 3 is a graph showing the result obtained by measurement with use of the magnetic sensor shown in FIG. 1 which is immersed in liquid nitrogen (77K). This magneto-resistive characteristic is obtained when a current of 1 mA is supplied to the magnetic sensor having a thickness of 10 microns. As shown in FIG. 3, the resistance of the magnetic sensor is kept at zero in the superconductive phase until the magnetic flux density B of a magnetic field applied thereto is increased up to a threshold value Bth. Thereafter the resistance increases very steeply when the magnetic flux density B is increased over the threshold value Bth.

Figure 4:
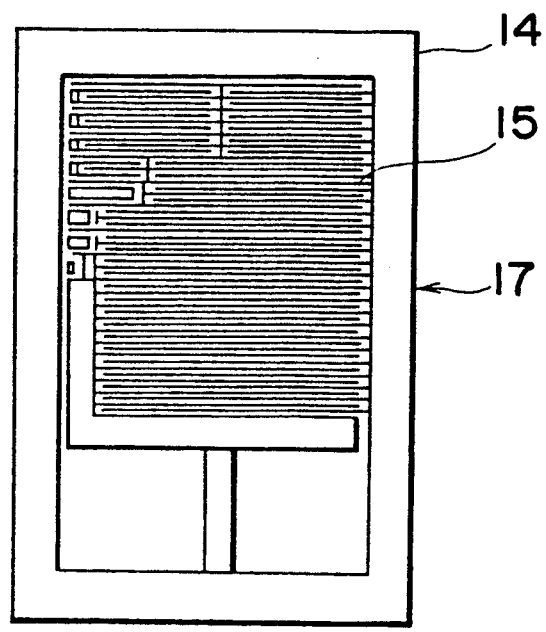
FIG. 4 is a top view of a platinum resistance thermometer to be used for measuring the temperature of the magnetic sensor shown in FIG. 1.

FIG. 4 shows a platinum resistance thermometer 17 to be used for measuring the temperature of the magnetic sensor.

The platinum resistance thermometer 17 is made as follows.

First of all, a film 15 of platinum having a thickness in the range from several thousands Å to several micron is formed on a substrate 14 of alumina by a spattering method etc.. Thereafter, a photoresist pattern film is formed on the film 15 of platinum. The film 15 of platinum is etched with use of the above photoresist pattern film by a spattering etching method so as to have a predetermined pattern. Furthermore, after the photoresist pattern film is removed therefrom, the film 15 of platinum formed on the substrate 14 of alumina is heated to a high temperature of about 1000° C. in air, and is shaped by a trimming method so as to have a predetermined resistance, resulting in that the platinum resistance thermometer 17 is obtained.

Figure 5:
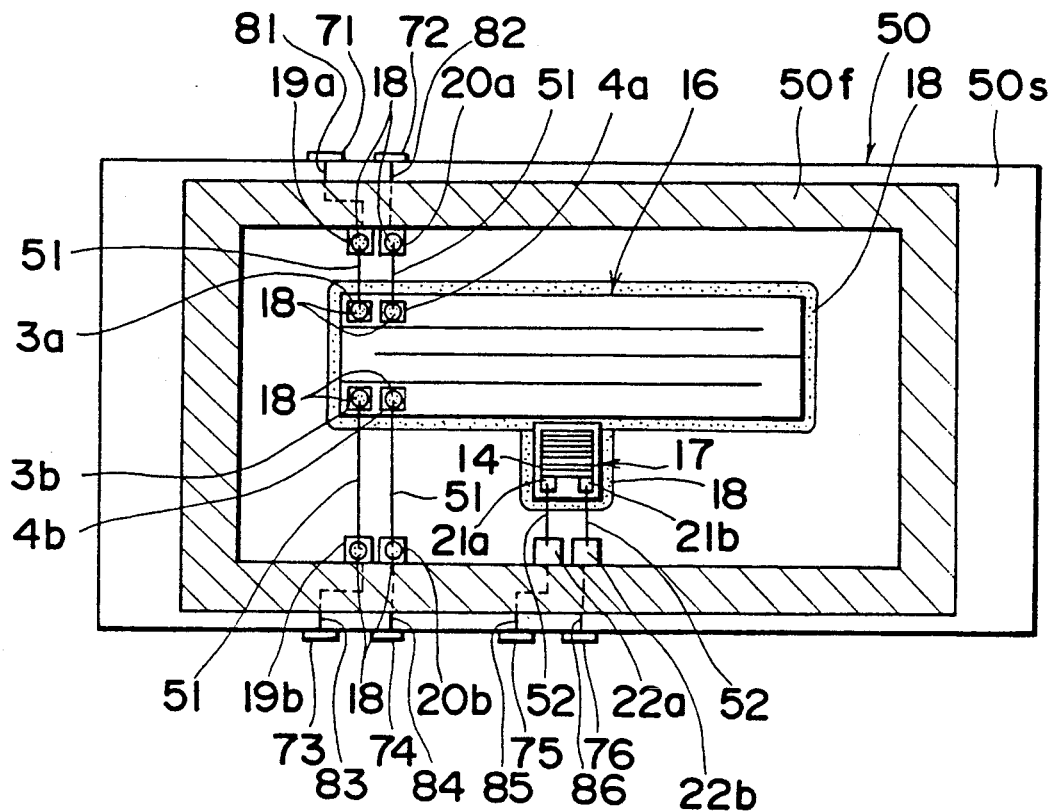
FIG. 5 is a top view of a superconductive magnetic field measuring apparatus utilizing the magnetic sensor shown in FIG. 1 and the platinum resistance thermometer shown in FIG. 4 which are packaged within a ceramic package.
Figure 6:
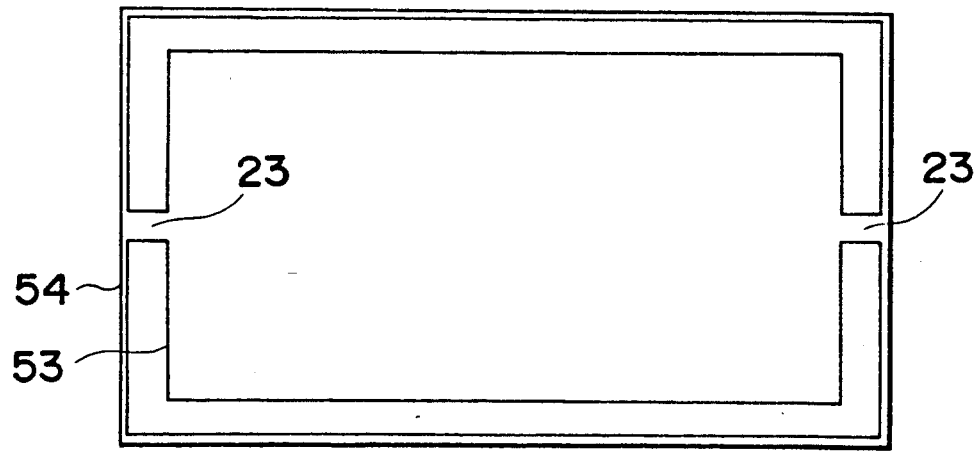
FIG. 6 is a top view of a glass plate for sealing the ceramic package on which a thermal hardening type resin is coated so as to form grooves therein.

The superconductive magnetic sensor 16 and the platinum resistance thermometer 17 which are made as described above are mounted on a ceramic package 50 as shown in FIG. 5 as follows.

The ceramic package 50 is comprised of a ceramic substrate 50s and a frame-shaped ceramic enclosure 50f which is bonded on the substrate 50s. On the outside surface of the substrate 50s, there are mounted six external pins 71 to 76. The external pins 71 to 76 are electrically connected to internal terminals 19a, 20a, 19b, 20b, 22a and 22b, respectively, through Cu connection lines 81 to 86 formed on the surface of the substrate 50s.

The superconductive magnetic sensor 16 and the platinum resistance thermometer 17 are bonded on the ceramic substrate 50s of the ceramic package 50 by use of thermal hardening type Ag paste 18 so that they are close to each other. The platinum resistance thermometer 17 is used for measuring the temperature of the superconductive magnetic sensor 16. A good thermal contact characteristic between the magnetic sensor 16 and the thermometer 17 can be obtained. Furthermore, since the substrate 14 of the platinum resistance thermometer 17 has substantially the same thermal conductivity as that of the magnetic sensor 16, the temperature of the superconductor of the magnetic sensor can be measured accurately. A pair of current electrodes 3a and 3b and a pair of voltage electrodes 4a and 4b of the magnetic sensor are respectively connected to the internal terminals 19a, 19b, 20a and 20b formed on the inner surface of the ceramic substrate 50s of the ceramic package 50 through lead wires 51 by use of the same thermal hardening type Ag paste 18 as that used upon bonding the lead wires onto the electrodes 3a, 3b, 4a and 4b, resulting in that a pair of current electrodes 3a and 3b and a pair of voltage electrodes 4a and 4b being connected to the external pins 71, 73, 72 and 74 of the ceramic package 50, respectively. Thereafter, the magnetic sensor is heated at 150° C. for can be hardened. Finally, electrodes 21a and 21b of the platinum resistance thermometer 17 are respectively connected to the internal terminals 22a and 22b formed on the inner surface of the ceramic substrate 50s of the ceramic package 50 through lead wires 52 by a bonding method, resulting in the electrodes 21a and 21b being respectively connected to the external pins 75 and 76 of the ceramic package 50.

After a thermal hardening type resin 53 having a relatively low thermal hardening temperature such as 110° C. to 150° C. is previously coated on a glass plate 54 for sealing the ceramic package 50 so as to form grooves 23 for ventilating between the inside of the ceramic package 50 and the outside thereof, the ceramic package 50 is sealed by the glass plate 54. Then, after the inside of the ceramic package 50 is evacuted to a vacuum of 10 mTorr or less, nitrogen gas having a purity of 99.99% or less is filled therein until the internal pressure thereof becomes 1.1 atm, resulting in the internal air within the ceramic package 50 being replaced with the nitrogen gas. Finally, the glass plate 54 is heated and pressed on the ceramic package 50 at 110° C. for 60 minutes, and further, it is heated and pressed thereon at 150° C. for 60 minutes so as to be completely bonded thereon, resulting in that a superconductive magnetic field measuring apparatus is made.

In the superconductive apparatus as constructed above, since the superconductive magnetic sensor 16 is bonded to the ceramic substrate 50s by use of the Ag paste 18 having a high thermal conductivity, there is almost no difference between the temperatures of the ceramic substrate 50s and the magnetic sensor 16 upon cooling them, resulting in the magnetic sensor 16 being cooled at substantially the temperature as that which the ceramic substrate 50s is cooled. Further, since the lead wires 51 and 52 are bonded on the internal terminals 19a, 19b, 20a, 20b, 22a and 22b, and the electrodes 3a, 3b, 4a, 4b, 21a and 21b by use of the Ag paste 18 having a high electrical conductivity, they are electrically connected to each other. Furthermore, since the internal air within the ceramic package 50 is replaced with the nitrogen gas which is an insert gas, namely, the internal air does not include an active gas such as oxygen gas, thereby reducing any reactions within the ceramic package 50.

In the above preferred embodiment, the magnetic sensor utilizing the superconductive magneto-resistive device is described. However, other superconductive apparatii utilizing a superconductive transistor or a Josephson device may be packaged in the same manner as that of the present preferred embodiment in order to improve the reliability of the superconductive apparatii.

Figure 7:
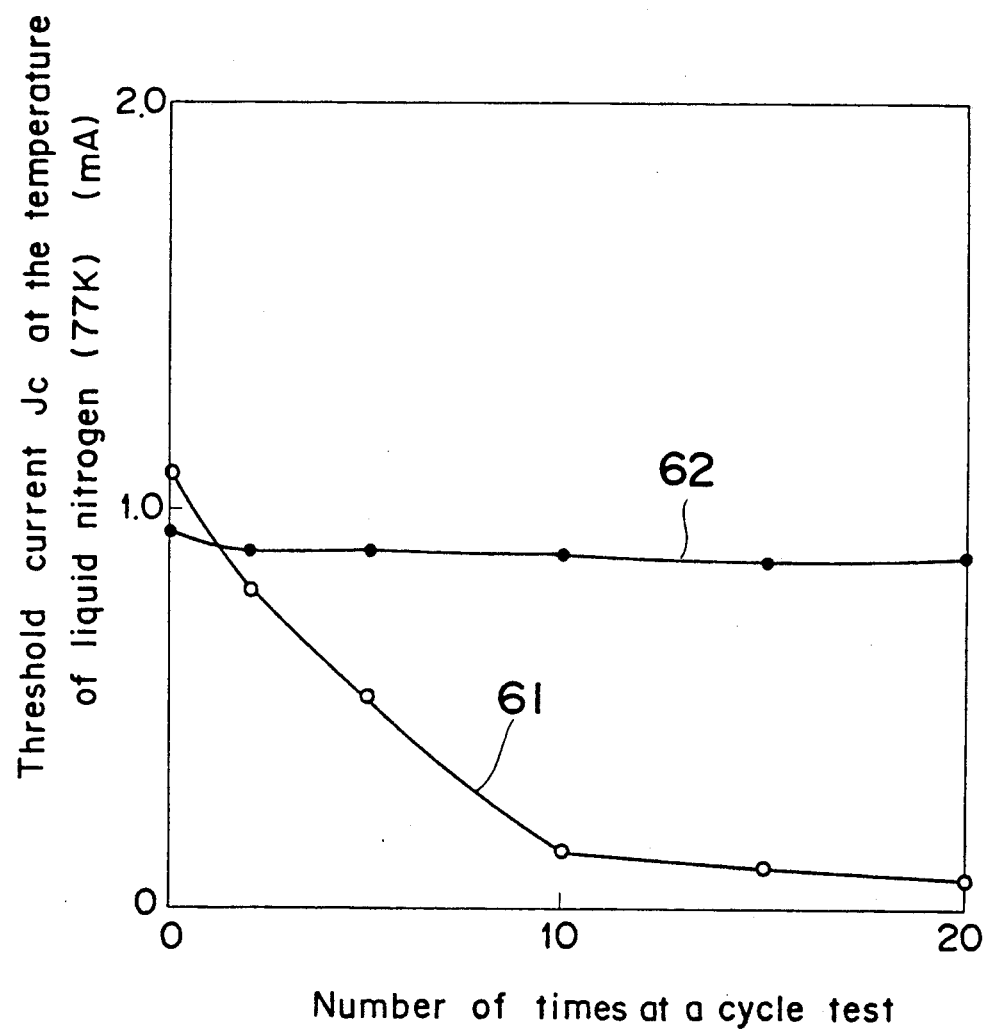
FIG. 7 is a graph showing the result obtained by a cycle test at which one cycle operation comprised of a room temperature operation and a liquid nitrogen operation is repeated a multiple of tens times for the packaged magnetic sensor and the conventional non-packaged magnetic sensor.

FIG. 7 shows the result obtained by a cycle test, at which one cycle operation comprised of a room temperature operation at which the superconductor is placed at room temperature for ten minutes and a liquid nitrogen operation at which the superconductor device is cooled to the temperature of liquid nitrogen (77K). This cycle is repeated a multiple of ten times for the packaged magnetic sensor and the conventional non-packaged magnetic sensor.

As shown in characteristic 61 of FIG. 7, when the conventional magnetic sensor not packaged is repeatedly cooled such that the superconductive magneto-resistive device is exposed to the atmosphere until the temperature thereof becomes the threshold temperature thereof or less, the magneto-resistive property thereof deteriorates due to drops of water adhering to the surface of the superconductive magneto-resistive device. However, after the above one cycle operation is repeated for the packaged superconductive magnetic field measuring apparatus a multiple of ten times, as shown in characteristic 62 of FIG. 7, the threshold current Jc of the superconductive magneto-resistive device at the temperature of liquid nitrogen (77K) almost does not decrease, and therefore, a stable operation of the measuring apparatus can be obtained.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A superconductive apparatus comprising:
    a ceramic oxide superconductive device having electrodes and having weak couplings formed by random grain boundaries; and
    an airtight package for mounting said ceramic oxide superconductive device therein;
    said airtight package including,
        a non-magnetic substrate,
        a frame-shaped non-magnetic enclosure bonded on said non-magnetic substrate, and
        a non-magnetic plate bonded on said non-magnetic enclosure;
    said ceramic oxide superconductive device being bonded on said non-magnetic substrate within a concave which is formed by said non-magnetic substrate and said non-magnetic enclosure;
    said airtight package having terminals electrically connected to said electrodes, said terminals providing an electrical connection for said ceramic oxide superconductive device to an external apparatus;
    said airtight package being sealed to create an airtight state around said ceramic oxide superconductive device after replacing internal air thereof with an insert gas.

2. The superconductive apparatus as claimed in claim 1, further comprising:
    a resistance thermometer for measuring temperature of said ceramic oxide superconductive device;

said resistance thermometer being mounted within said airtight package so as to be close to said ceramic oxide superconductive device.

3. The superconductive apparatus as claimed in claim 2, wherein said resistance thermometer is a platinum resistance thermometer.

4. The superconductive apparatus as claimed in claim 1, wherein said ceramic oxide superconductive device is a superconductive magneto-resistive device.

5. The superconductive apparatus as claimed in claim 1, wherein said ceramic oxide superconductive device is a superconductive transistor.

6. The superconductive apparatus as claimed in claim 1, wherein said ceramic oxide superconductive device is a Josephson device.

7. The superconductive apparatus as claimed in claim 4, wherein said ceramic oxide superconductive magneto-resistive device is used as a magnetic sensor.

8. The superconductive apparatus as claimed in claim 1, wherein said ceramic oxide superconductive device is bonded to said airtight package using Ag paste.

9. The superconductive apparatus as claimed in claim 1, wherein said inert gas is nitrogen gas.

10. The superconductive apparatus as claimed in claim 1, wherein said inert gas in said airtight package is at 1.1 atmospheric pressure (atm).

* * * * *